United States Patent [19]
Kim

[11] Patent Number: 6,046,950
[45] Date of Patent: Apr. 4, 2000

[54] SENSE AMPLIFIER BLOCK LAYOUT FOR USE IN A DYNAMIC RANDOM ACCESS MEMORY

[75] Inventor: Keum-Yong Kim, Kyunggi-do, Rep. of Korea

[73] Assignee: Samsung Electronics Co., Ltd., Rep. of Korea

[21] Appl. No.: 09/312,468

[22] Filed: May 17, 1999

[30] Foreign Application Priority Data

May 30, 1998 [KR] Rep. of Korea ........................ 98-19999

[51] Int. Cl.[7] ........................................................ G11C 7/00
[52] U.S. Cl. ............................................. 365/205; 365/203
[58] Field of Search ..................................... 365/205, 203

[56] References Cited

U.S. PATENT DOCUMENTS 5,701,268  12/1997  Lee et al. .................................. 365/205

*Primary Examiner*—David Nelms
*Assistant Examiner*—M. Tran
*Attorney, Agent, or Firm*—Myers Bigel Sibley & Sajovec

[57] ABSTRACT

A semiconductor memory device of the present invention comprises at least two memory cell blocks having a plurality of bit line pairs, respectively, and a plurality of sense amplifier blocks arranged between the memory cell blocks. Each sense amplifier block has two bit line precharge transistors, one equalization, and two bit line isolation transistors. The device further comprises an unit precharge-isolation region which has a) an width in which two bit line pairs are disposed, wherein the transistors are fabricated in the unit precharge-isolation region, b) two active regions arranged in the unit precharge-isolation region, wherein the precharge and equalization transistors are placed in the other of the active regions, and c) five active to bit line contacts arranged in zigzag within the active regions. According to the structure of the present invention, three gate electrodes of the transistors are disposed at the corresponding active regions in "h-l-l" shape.

5 Claims, 3 Drawing Sheets

SENSE AMPLIFIER BLOCK LAYOUT FOR USE IN A DYNAMIC RANDOM ACCESS MEMORY

FIELD OF THE INVENTION

The present invention relates to an ultra high integration density semiconductor memory device and, more particularly to a sense amplifier block layout suitable for an ultra high integration density semiconductor memory device.

BACKGROUND OF THE INVENTION

Recently, a semiconductor memory device, particularly a dynamic random access memory (referred to as "a DRAM") device tends to be high integrated more rapidly than other memory devices. Many makers have made every endeavor to implement an ultra high integration density DRAM (for example, having the capacity of 1-giga bits). One of such tries lays out within a given area a sense amplifier block (14, refer to FIG. 1) consisting of bit line precharge and isolation sections, P- and N-latch sense amplifier sections, an input/output gating section, etc.

It is needless to say that plural bit lines provided in the DRAM may be positioned by a type of an open bit line structure, a folded bit line structure, or the other. Typically, in such a DRAM that the bit lines are arranged in accordance with the folded bit line structure, there is disposed the sense amplifier block associated with a pair of bit lines within a width (or pitch) in which four bit lines are positioned. As well known, a memory cell array of the DRAM consists of a plurality of memory cell blocks, and sense amplifier blocks are laid out between two adjacent memory cell blocks so as to share each pair of bit lines provided respectively in the two adjacent memory cell blocks.

The higher the integration density of the DRAM, the shorter the distance (or space) between any two adjacent bit lines through which the data stored in the memory cell block is read to be amplified by a sense amplifier block. In case that the distance between two adjacent bit lines becomes shorter according to tendency of high integration density, an area in which one sense amplifier block is laid out (hereinafter, referred to as an unit area) also has to be reduced. However, it is impossible that the sense amplifier block for us in the DRAM of an ultra high integration density is arranged within the unit area thus reduced by use of present process and design techniques. Therefore, it is required a new sense amplifier block layout capable of being positioned within the unit area thus reduced.

SUMMARY OF THE INVENTION

It is therefore an object of the present invention to provide an new sense amplifier block layout suitable for an ultra high integration density semiconductor memory device.

In order to attain the above objects, according to an aspect of the present invention, there is provided a semiconductor memory device which comprises at least two memory cell blocks having a plurality of bit line pairs, respectively; a plurality of sense amplifier blocks arranged between the memory cell blocks, wherein each sense amplifier block has two bit line precharge transistors, one equalization, and two bit line isolation transistors; and an unit precharge-isolation region having a) an width in which two bit line pairs are disposed, wherein the transistors are fabricated in the unit precharge-isolation region, b) two active regions arranged in the unit precharge-isolation region, wherein the precharge and equalization transistors are placed in the other of the active regions, and c) five active to bit line contacts arranged in zigzag within the active regions. Three gate electrodes of the transistors are disposed at the corresponding active regions in "h-l-l" shape.

In the device, active to bit line contacts corresponding to the equalization transistor of the active to bit line contacts are disposed perpendicular to the bit line direction and so as not to be overlapped to each other, and active to bit line contacts corresponding to the bit line isolation transistors of the active to bit line contacts are disposed perpendicular to the bit line direction and so as not to be overlapped to each other.

According to another aspect of this invention, there is provided a semiconductor memory device which comprises at least two memory cell blocks having a plurality of bit line pairs; a plurality of sense amplifier blocks arranged between the memory cell blocks, wherein each sense amplifier block has an N-latch sense amplifier consisting of two NMOS transistors provided with a predetermined sense-amplification voltage; and an unit sense amplifier region having a) a width in which two bit line pairs are arranged, wherein the NMOS transistors are fabricated in the unit sense amplifier region, b) two active regions arranged in the unit sense amplifier region, wherein the NMOS transistors are respectively placed in the corresponding active regions, c) two active to metal contacts each arranged at the corresponding active regions and provided with the sense-amplification voltage, and d) two active to bit line contacts each arranged at the corresponding active regions. The two gate electrodes of each NMOS transistor are disposed at the corresponding active regions in the bit line direction and have stretched shape.

According to still another aspect of this invention, there is provided a semiconductor memory device which comprises at least two memory cell blocks having a plurality of bit line pairs; a plurality of sense amplifier blocks arranged between the memory cell blocks, wherein each sense amplifier block has a P-latch sense amplifier consisting of two PMOS transistors provided a predetermined sense-amplification voltage; and an unit sense amplifier region having a) a width in which two bit line pairs are arranged, wherein the PMOS transistors are fabricated in the unit sense amplifier region, b) two active regions arranged in the unit sense amplifier region, wherein the PMOS transistors are respectively placed in the corresponding active regions, c) two active to metal contacts each arranged at the active regions and provided with the sense-amplification voltage, and d) two active to bit line contacts each arranged at the corresponding active regions. The two gate electrodes of the PMOS transistors are arranged at the corresponding active regions in the bit line direction and have bent shape.

DESCRIPTION OF THE PREFERRED EMBODIMENTS

Hereinafter, a preferable embodiment of the present invention will be described with reference to the accompanying drawings.

Figure 1:
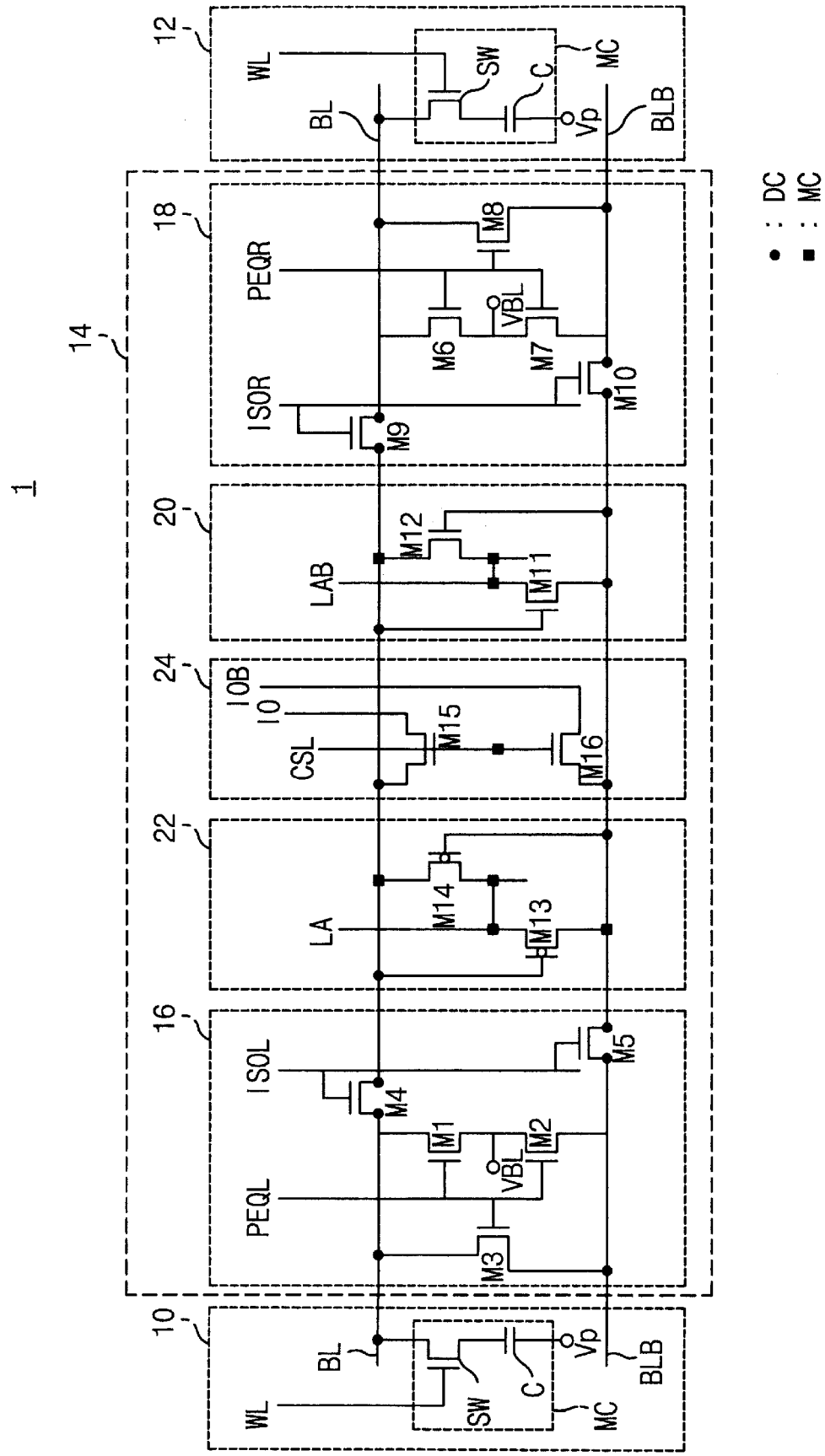
FIG. 1 shows a sense amplifier block associated with two adjacent memory cell blocks according to the present invention.

FIG. 1 shows a sense amplifier block associated with two memory cell blocks.

Referring to FIG. 1, a semiconductor memory device 1, particularly a DRAM device, comprises two memory cell blocks 10 and 12, and a sense amplifier block 14 laid out between the memory cell blocks 10 and 12. Each of the memory cell blocks 10 and 12 is constituted of a pair of bit lines BL and BLB, a word line WL, a memory cell MC consisting of an NMOS transistor SW and a capacitor C. Constitution associated with only one memory cell MC is illustrated in the respective memory cell blocks 10 and 12.

The sense amplifier block 14, as well known, senses and amplifies cell data stored in the memory cell MC of any selected memory cell block 10 or 12, and outputs the data thus sensed and amplified into a pair of input/output lines IO and IOB. The sense amplifier block 14 is designed so as to share each pair of bit lines BL and BLB in two adjacent memory cell blocks 10 and 12, as shown in FIG. 1. For example, when the memory cell block 10 at a left side is selected, the sense amplifier block 14 is electrically disconnected with the memory cell block 12 at a right side by a bit line precharge-isolation section 18. On the other hand, when the memory cell block 12 at the right side is selected, the sense amplifier block 14 is electrically disconnected with the memory cell block 10 at the left side by a bit line precharge-isolation section 16. The sense amplifier block 14 comprises two bit line precharge-isolation sections 16 and 18 each corresponding to the memory cell blocks 10 and 12, an N-latch sense amplifier section 20, a P-latch sense amplifier section 22, and an input/output gating section 24. In FIG. 1, intersection points ● and ■ indicate a direct contact DC and a metal contact MC, respectively.

Figure 2:
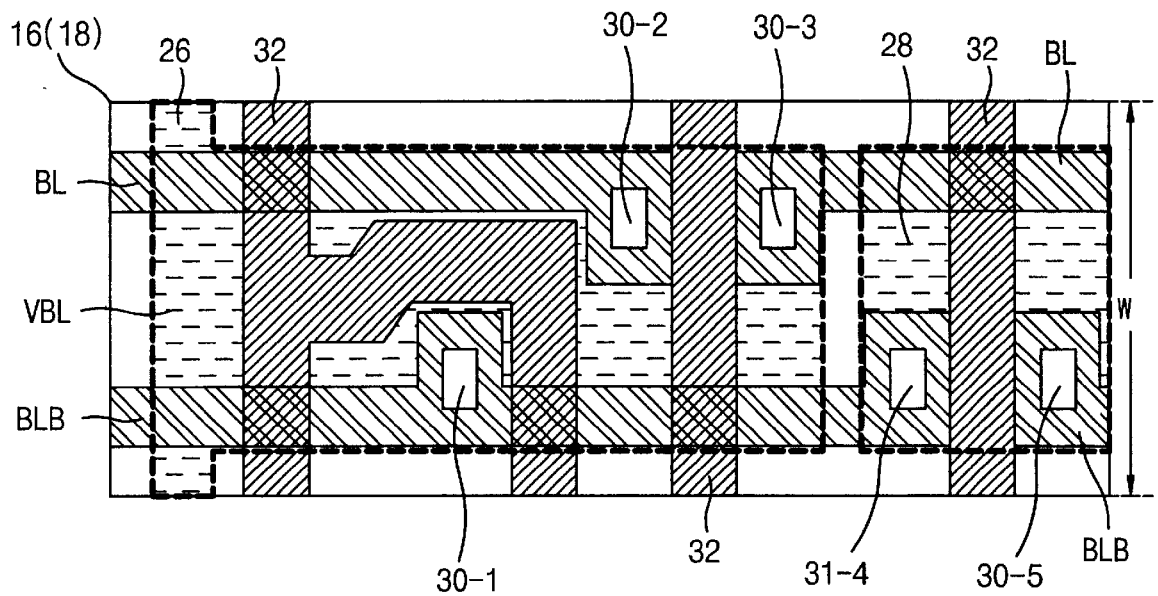
FIG. 2 is a layout diagram of a bit line precharge-isolation section according to a preferable embodiment of the present invention.

A layout diagram of a bit line precharge-isolation section 16/18 according to a preferable embodiment of the present invention is illustrated in FIG. 2. For descriptive ease, one of the two bit line precharge-isolation sections 16 and 18 is illustrated in FIG. 2. However, the other is laid out equally to that, and description thereof is thus omitted.

Referring to FIG. 2, first and second active regions 26 and 28 are formed within a bit line precharge-isolation location 16 having a width W in which 4 bit lines (that is, two pairs of bit lines) are laid out. Within the first active region 26, four NMOS transistors M1 through M4 of FIG. 1 are fabricated, and which the second active region 28, an NMOS transistor M5 of FIG. 1 are formed. Five active to bit line contacts 30-1, 30-2, 30-3, 30-4, and 30-5, which are formed by the direct contact process well known in the art, are laid out in zigzag and are not overlapped in the direction orthogonal to the bit line direction to each other. Gate electrodes 32 of the five NMOS transistors M1 through M5 constituting the bit line precharge-isolation section 16 of FIG. 1 are laid out so at to have "h-l-l" shape on the active regions 26 and 28.

In FIG. 2, an active region supplied with bit line precharge/equalization voltage VBL, the active to bit line contact 30-1 and the gate electrode of "h" shape constitutes the NMOS transistor M1, and the active region supplied with bit line precharge/equalization voltage VBL, the active to bit line contact 30-2 and the gate electrode of "h" shape constitutes the NMOS transistor M2. The NMOS transistor M3 is formed of the contacts 30-1 and 30-2 acting as its source and its drain (or drain and source) and the gate electrode 32 of "h" shape therebetween. And, the active to bit line contacts 30-2 and 30-3 and the gate electrode of "l" shape therebetween constitutes the NMOS transistor M4. As set forth above, the four NMOS transistors M1 to M4 are formed within the first active region 26. Within the second active region 28 isolated from the first active region 26, there is formed the NMOS transistor M5 consisting of active to bit line contacts 30-4 and 30-5 and the gate electrode 32 of "l" shape positioned therebetween.

Herein, the gate electrodes 32 of "l" shape are connected to a line ISOL of FIG. 1, and the gate electrode 32 of "h" shape is connected to a line PEQL of FIG. 1.

Figure 3:
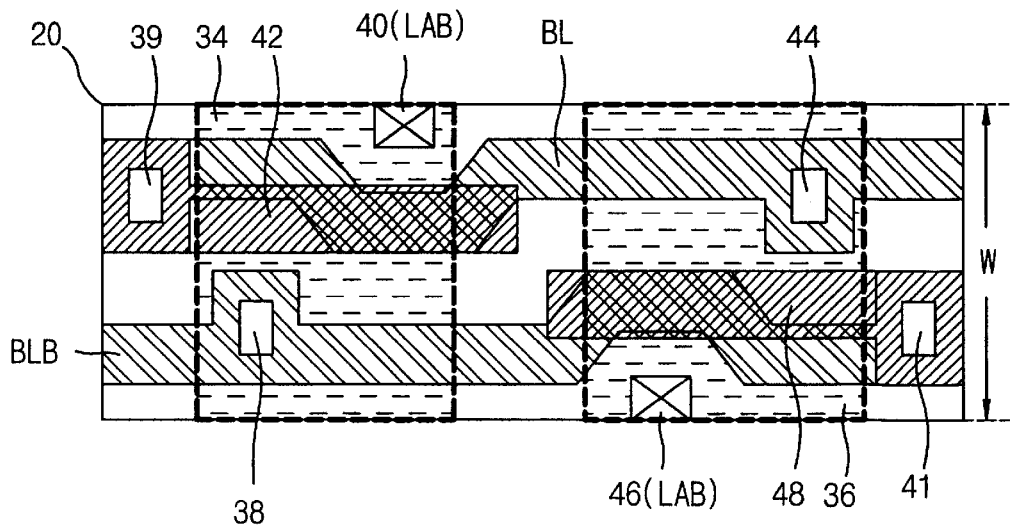
FIG. 3 is a layout diagram of an N-latch sense amplifier section according to a preferable embodiment of the present invention.

A layout diagram of an N-latch sense amplifier section 20 according to a preferable embodiment of the present invention is illustrated in FIG. 3. Referring to FIG. 3, first and second active regions 34 and 36 are formed within an N-latch sense amplifier location 20 having a width W in which 4 bit lines (that is, two pairs of bit lines) are laid out.

One active to bit line contact 38 and one active to metal contact 40 are formed within the first active region 34 as illustrated in FIG. 3. A sense-amplification voltage LAB of FIG. 1 is supplied to the active to metal contact 40. Within the first active region 34, a gate electrode 42 is formed which extends to the same direction as the bit line BL and has "-" shape. Active regions, in which the active to metal contact 40 and the active to bit line contact 38 are formed respectively, and the gate electrode 42, which is connected to the bit line BL through an active to bit line contact 39, form the NMOS transistor M11 of FIG. 1.

Within the second active region 36, one active to bit line contact 44 and one active to metal contact 46 are formed as illustrated in FIG. 3. The sense-amplification voltage LAB is supplied to the active to metal contact 46. As shown in FIG. 3, the contacts 40 and 46 are disconnected with each other. Within the second active region 36, a gate electrode 48 is formed which extends to the same direction as the bit line BLB and has "-" shape. Active regions, in which the active to metal contact 48 and the active to bit line contact 44 are formed respectively, and the gate electrode 48, which is connected to the bit line BLB through an active to bit line contact 41, form the NMOS transistor M12 of FIG. 1.

Figure 4:
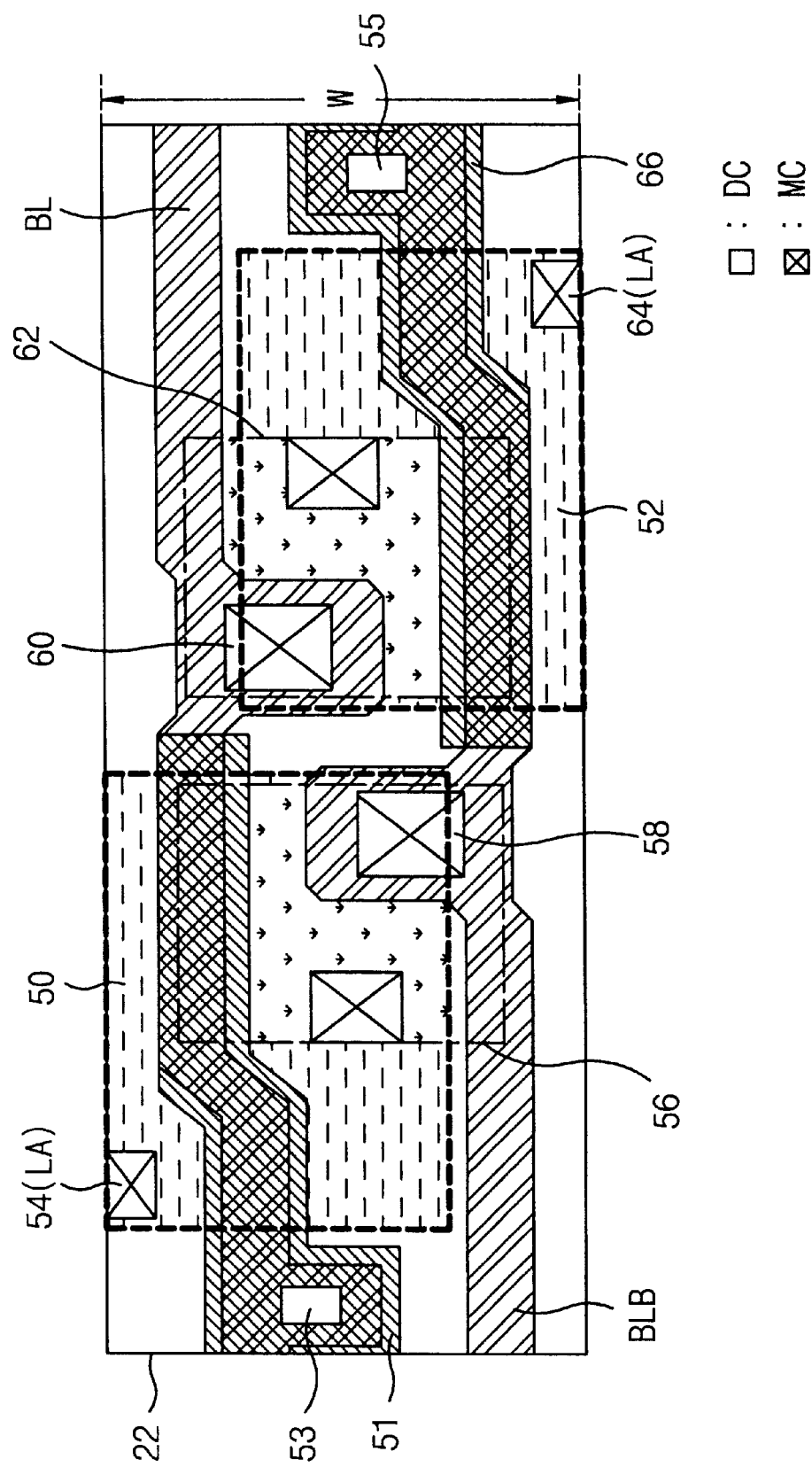
FIG. 4 is a layout diagram of a P-latch sense amplifier section according to a preferable embodiment of the present invention.

A layout diagram of a P-latch sense amplifier section 22 according to a preferable embodiment of the present invention is illustrated in FIG. 4.

Referring to FIG. 4, a P-latch sense amplifier region 22 has a width in which four bit lines, that is, two pairs of bit lines, are laid out. Within the P-latch sense amplifier region 22, there are formed first and second active regions 50 and 52 in which PMOS transistors M13 and M14 are fabricated respectively. Within the first active region 50, a gate electrode 51 connected through an active to bit line contact 53 to the bit line BL extends to the same direction as the bit line BL and has bent shape. Similarly, within the second active region 52, a gate electrode 66 connected through an active to bit line contact 55 to the bit line BLB extends to the same direction as the bit line BLB and has bent shape.

As well known in the art, source/drain of a PMOS transistor is connected to a bit line BL/BLB through a metal layer 56/62 instead of a direct contact. Therefore, as illustrated in FIG. 4, a bit line BLB contact 58 within the first active region 50 is connected through a metal layer 56 to the first active region 50. Likewise, a bit line BL contact 60 within the second active region 52 is connected through a metal layer 62 to the second active region 52. A gate electrode 66 connected through the contact 55 to the bit line BLB and formed within the second active region 52 extends to the same direction as the bit line BLB and has bent shape. A gate electrode 51 connected through the contact 53 to the bit line BL and formed within the first active region 50 extends to the same direction as the bit line BL and has bent shape. And, within the first and second active regions 50 and 52, metal contacts 54 and 64 are respectively formed which supply corresponding active regions 50 and 52 with a sense-amplification voltage LA.

As the transistors constituting the sense amplifier block 14 are laid out as described above, the sense amplifier block for use in an ultra high integration density DRAM can be laid out within an unit area (four bit lines are positioned therein) even though the distance (or pitch) between any two adjacent bit lines is reduced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device comprising:
   at least two memory cell blocks having a plurality of bit line pairs, respectively;
   a plurality of sense amplifier blocks arranged between the memory cell blocks, wherein each sense amplifier block has two bit line precharge transistors, one equalization, and two bit line isolation transistors; and
   an unit precharge-isolation region having a) an width in which two bit line pairs are disposed, wherein the transistors are fabricated in the unit precharge-isolation region, b) two active regions arranged in the unit precharge-isolation region, wherein the precharge and equalization transistors are placed in the other of the active regions, and c) five active to bit line contacts arranged in zigzag within the active regions,
   wherein three gate electrodes of the transistors are disposed at the corresponding active regions in "h-l-l" shape.

2. The semiconductor memory device according to claim 1, wherein active to bit line contacts corresponding to the equalization transistor of the active to bit line contacts are disposed perpendicular to the bit line direction and so as not to be overlapped to each other, and active to bit line contacts corresponding to the bit line isolation transistors of the active to bit line contacts are disposed perpendicular to the bit line direction and so as not to be overlapped to each other.

3. A semiconductor memory device comprising:
   at least two memory cell blocks having a plurality of bit line pairs;
   a plurality of sense amplifier blocks arranged between the memory cell blocks, wherein each sense amplifier block has an N-latch sense amplifier consisting of two NMOS transistors provided with a predetermined sense-amplification voltage; and
   an unit sense amplifier region having a) a width in which two bit line pairs are arranged, wherein the NMOS transistors are fabricated in the unit sense amplifier region, b) two active regions arranged in the unit sense amplifier region, wherein the NMOS transistors are respectively placed in the corresponding active regions, c) two active to metal contacts each arranged at the corresponding active regions and provided with the sense-amplification voltage, and d) two active to bit line contacts each arranged at the corresponding active regions,
   wherein two gate electrodes of each NMOS transistor are disposed at the corresponding active regions in the bit line direction and have stretched shape.

4. A semiconductor memory device comprising:
   at least two memory cell blocks having a plurality of bit line pairs;
   a plurality of sense amplifier blocks arranged between the memory cell blocks, wherein each sense amplifier block has a P-latch sense amplifier consisting of two PMOS transistors provided a predetermined sense-amplification voltage; and
   an unit sense amplifier region having a) a width in which two bit line pairs are arranged, wherein the PMOS transistors are fabricated in the unit sense amplifier region, b) two active regions arranged in the unit sense amplifier region, wherein the PMOS transistors are respectively placed in the corresponding active regions, c) two active to metal contacts each arranged at the active regions and provided with the sense-amplification voltage, and d) two active to bit line contacts each arranged at the corresponding active regions,
   wherein two gate electrodes of the PMOS transistors are arranged at the corresponding active regions in the bit line direction and have bent shape.

5. The semiconductor memory device according to claim 4, wherein said two active regions are connected to the corresponding bit lines through metal layers, respectively, to thereby form the active to bit line contacts.

* * * * *